United States Patent

Valente et al.

[11] Patent Number: 5,906,882
[45] Date of Patent: *May 25, 1999

[54] DIELECTRIC MATERIALS HIGH METALLIC CONTENT

[76] Inventors: Thomas J. Valente, 7010 Via Coello, La Costa, Calif. 92009; Henri J. A. Charmasson, 2030 Sunset Blvd., San Diego, Calif. 92103

[*] Notice: This patent is subject to a terminal disclaimer.

[21] Appl. No.: 09/080,097

[22] Filed: May 18, 1998

Related U.S. Application Data

[63] Continuation of application No. 08/786,701, Jan. 1, 1997, Pat. No. 5,789,064, and a continuation-in-part of application No. 08/394,616, Feb. 27, 1995, abandoned, and a continuation-in-part of application No. 08/160,428, Nov. 30, 1993, Pat. No. 5,393,568, which is a continuation of application No. 08/060,162, May 7, 1993, abandoned, and a continuation-in-part of application No. 07/843,951, Feb. 28, 1992, abandoned.

[51] Int. Cl.⁶ .............................. B32B 5/16; D06N 7/04; H05K 9/00; G21F 1/10

[52] U.S. Cl. ................ 428/148; 174/35 R; 428/141; 428/143; 428/328; 523/137; 524/439

[58] Field of Search ................... 428/148, 141, 428/143, 328; 174/35 R; 523/137; 524/439

[56] References Cited

U.S. PATENT DOCUMENTS

| | | | |
|---|---|---|---|
| 4,046,739 | 9/1977 | Lacona | 260/75 M |
| 4,935,056 | 6/1990 | Miyasaka | 75/231 |
| 5,789,064 | 8/1998 | Valente et al. | 428/148 |

*Primary Examiner*—Patrick D. Niland
*Attorney, Agent, or Firm*—Henri J. A. Charmasson; John D. Buchaca

[57] ABSTRACT

Atomized metal particles distributed within a resin matrix form a composite that can be selectively heated by exposure to microwave radiations. The composites can also be formed into non-electrically conductive but thermally conductive dielectric and magnetic structures by appropriate selection of metal particles and matrix materials.

10 Claims, 1 Drawing Sheet

DIELECTRIC MATERIALS HIGH METALLIC CONTENT

PRIOR APPLICATION

This application is a continuation of application Ser. No. 08/786,701 filed Jan. 1, 1997 now U.S. Pat. No. 5,789,064, a continuation-in-part of abandoned application Ser. No. 08/394,616 filed Feb. 27, 1995 a continuation-in-part of Ser. No. 08/160,428 filed Nov. 30, 1993, now U.S. Pat. No. 5,393,568, a continuation of Ser. No. 08/060,162 filed May 7, 1993 now abandoned, a continuation-in-part of Ser. No. 07/843,951 filed Feb. 28, 1992 now abandoned.

FIELD OF THE INVENTION

This invention relates to the manufacture of dielectric materials and to electromagnetic radiation absorbing materials which are commonly used in the manufacture of electromagnetic shielding structures and anechoic chambers.

BACKGROUND OF THE INVENTION

This invention is based on metallic compositions and metallic coating and molding processes disclosed in the grand-parent application Ser. No. 08/160,428 filed on Nov. 30, 1993, now U.S. Pat. No. 5,393,568 issued on Feb. 28, 1995 which application and patent are incorporated in this application by this reference.

This invention results from experimentations with metal/resin composites originally developed for the protective coating of underwater structures against chemical and biological fouling and heat-dissipating electrical insulators. It was found that through selective apportioning and dispersion of metal powders into resin-based materials, composites could be created that exhibit certain specific characteristics of one of the components while excluding some other common characteristics of those components. For instance, the grand-parent application teaches how to form a composite that exhibits many of the mechanical characteristics of a particular metal while remaining electrically non-conductive.

It was thought that by extending the range and type of components, metal composites having broader applications in many fields of human endeavor could be developed.

SUMMARY OF THE INVENTION

The principal and secondary objects of this invention are to provide a new type of electromagnetic radiation absorbing materials which also exhibits metallic characteristics not usually found in some of the compositions previously used in shielding and anechoic structures.

Other objects of this invention are to provide a new type of electromagnetic radiation absorbing materials which also exhibits physical characteristics not usually found in some of the compositions previously used in microwave-heated structures.

It is also an object of this invention to provide a novel process for sintering together atomized particles of metal of different density into an homogeneous composite.

Another object of the invention is to create non-electrically conductive magnets.

A further object of the invention is to modify the mechanical and electrical properties of certain materials such as their thermal conductivity, thermal expansion, dielectric constant, or resistivity.

These and other valuable objects are achieved by a selective dispersion or loading of sintering metal powder particles in a thermo plastic or thermo-setting resin-based matrix, then curing or sintering the composition depending upon the type of composite material needed. The powder particles are selected from atomized metal particles commonly used in sintering processes with mesh ranging from 2 to 150 microns selected fro a group including metals such copper, zinc, aluminum, iron, and silver; oxides of said metals; alloys such as pewter, brass, bronze, and stainless as well as tungsten, molybdenum, cobalt and other metals used in powder metallurgy. It has been found that use of oxidized powders allow for a higher metal concentration while maintaining high resistivity of the composite.

In most applications, the preferred type of thermo-setting resin is a mixture of substantially equal volumes of an air-inhibited unsaturated polyester resin such as commonly called "gel-coats" with an air-cured unsaturated polyester resin.

DESCRIPTION OF THE PREFERRED EMBODIMENTS OF THE INVENTION

Figure 1:
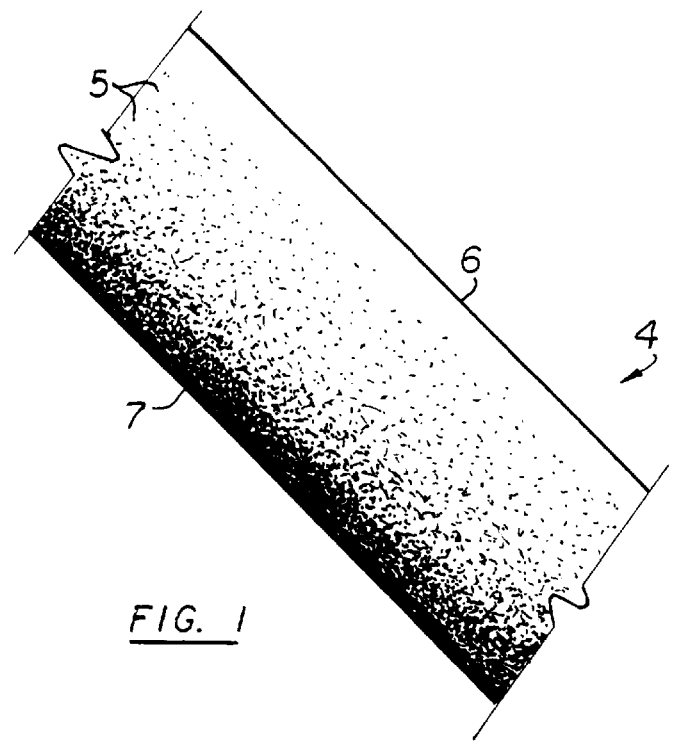
FIG. 1 is a diagrammatical illustration of metal particle repartition in compositions according to the invention.

A first type of electromagnetic radiation-absorbing composition is made by mixing a thermo-setting synthetic resin with up to 95% per weight of an atomized metal particles of the type used in powder metallurgy having a mesh ranging from 2 to 150 microns, admixing an appropriate catalyst, then letting the composition cure at room temperature or under temperatures of up to 150 degrees C. When such a composition is exposed to a source of electromagnetic radiations (EMRs) such as microwaves, a substantial percentage of the radiations are absorbed by the metal particles and transformed into heat. Depending upon the type of resin and the concentration of metal particles, temperatures up to 200 degrees centigrade can be reached without affecting the integrity of the composition.

Accordingly, heat can be generated about a surface coated with such a composition by exposing the surface to microwave radiations.

One application of such a technique is the de-icing of an airplane wing coated with such a metallic composite by exposure to a microwave source.

When the heat dissipated by the powder particles is allowed to rise to above 300 degrees Celsius under the microwave radiations, the resin is vaporized and the metal particles crumble into powder. This phenomenon can be taken advantage of in forming molds and other temporary structures that need to be eliminated in the course of the manufacturing process. Thus, the selective injection or application of the metallic composition into particular areas of a structure allow the selective heating of those sections by exposure of the entire structure to EMRs.

A second type of metallic composition is obtained by using a thermo-plastic material. In such case, the composition can be softened to a malleable state by exposure to EMRs. Thus, the dispersion of metal particles into particular sections of a thermo-plastic structure allows the selective softening or mollifying of those sections of the structure while the remainder of the structure which do not contain the metal particles remains in a solid state.

The above-described techniques can also be applied to the fabrication of packages and heat-dissipating substrates used in the construction of micro-electronic chips. These types of structures must have a coefficient of thermal expansion in the same range as the coefficient of expansion of the silicon, germanium, gallium arsenide, and other materials used in the fabrication of the chip itself with which they are in contact. If such a structure was allowed to expand under heat to larger extent than the components in contact with it, cracks and other defects may develop during heat tests due to the uneven expansion of the interconnected components. These structures are usually made from a composite of copper and certain percentages of metals such as tungsten and molybdenum which have a much lower coefficient of expansion than the copper, as disclosed in U.S. Pat. No. 4,788,627 Ehlert et al. which is incorporated in this specification by this reference. By adjusting the proportions of copper versus the other metals a specific coefficient of expansion can be achieved. The composites are obtained by sintering mixtures of copper powder and tungsten or molybdenum powders. Stable and homogeneous mixtures of those metal powders are very difficult to create due to the high difference in density between, for example, the copper and the tungsten powders. When mixtures of micron-sized particles of copper and tungsten are poured into a sintering mold or manipulated in any fashion, the heavier tungsten particles tend to sink toward the bottom affecting the homogeneity of the final composite.

Applying the teachings of this invention, powders of micron-sized particles of copper and tungsten are mixed with a thermo-setting resin powder such as polyester in the presence of a catalyst creating a tacky slurry which is cured to a solid by exposure to temperatures up to 150 degrees Celsius. The viscous state of the mixture prevents the heaviest tungsten particles from concentrating toward the bottom before the substance is fully cured. The block of mixed material is heated by exposure to microwaves to a temperature of approximately 1,350 Centigrade under pressures up to 3,500 Atmospheres (51,000 psi). This temperature is sufficient to vaporize the resin component and melt the surface of the copper particles enough to adhere to the surrounding tungsten particles. The material is then cooled resulting in a green compact. The compact can be machined prior to being sintered at temperatures up to 1,500 degrees Centigrade under high pressure to allow the copper particles to melt and flow closely around the tungsten particles, thus creating an homogeneous composite of low porosity having the desired coefficient of thermal expansion corresponding to the selected proportion of copper and tungsten powder components. Alternately, the compact forming step can be by-passed by melting the resin and sintering the composite in a single operation under high pressure.

Although non-electrically conductive magnets may be manufactured using ferrite materials with no or very little concentration of divalent ions, in some applications it might be advantageous to retain a certain amount of divalent ions in order, for instance, to maintain a high dielectric constant and reduce capacitive storage in the material. Such type of non-electrically conductive magnets can be manufactured according to the invention as composites consisting of particles of ferromagnetic materials including ferrites dispersed in a plastic matrix preferably selected from plastics having a relatively high dielectric constant, typically epoxy resins, and phenol-based plastics such as those sold under the brand names Bakelite BM, Catalin 200, Durite 500 and Formica XX.

Corollarily, improved dielectric materials with high thermal conductivities can be created by dispersing the atomized metallic powder particles in a matrix of resin or other plastic material exhibiting a low dielectric constant such as those sold under the mark Teflon and composites of the same.

It has been found that the dielectric constant of a plastic material is a function of the type, mesh and concentration of metal particles dispersed therein. For example, in printed circuit boards manufactured according to the teachings of U.S. Pat. No. 5,393,568 the dielectric constant of the board can be increased by using a higher concentration of oxided copper particles in order to reduce crosstalk between high frequency signals passing through adjacent leads.

In addition, the dispersion of atomized sintering powders in ceramic materials can also be used to modify characteristics of said materials such as thermal conductivity, thermal expansion, dielectric constant and electrical conductivity.

In these first embodiments, the dispersion of the metal particles is preferably homogeneous throughout the composite.

In some applications the particle may include ferrmagnetic material including ferrites.

Figure 2:
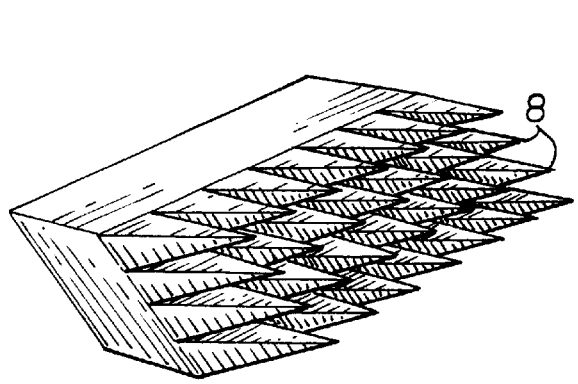
FIG. 2 is a partial perspective view of an anechoic surface.
Figure 3:
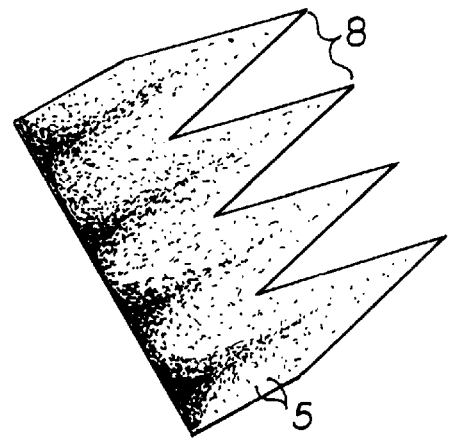
FIG. 3 is a cross-sectional view thereof.

A second type of metallic composition is produced by gradually increasing the concentration of metal particles through the entire thickness of the material. In the example 4 of composition illustrated in FIG. 1, the concentration of metal particles 5 is non-existent just below the front surface 6, then begins, and progressively increases through the thickness of the material until that concentration becomes 100% along the back edges 7. When such a material is impinged by EMRs and in particular by centimeter waves such as radar waves, the energy of each wave is progressively, partially absorbed and turned into heat, and partially reflected back and forth between the metal particles with only a small percentage of radiation being reflected outside the material at various angles. Accordingly, the radiation energy is progressively absorbed and dispersed with little or no reflection toward the source of the radiation. The energy dispersing capability of the structure can be improved by shaping the front surface of the layer of composite material into pointed projections 8 as illustrated in FIGS. 2 and 3. Accordingly, such a composition can be used in the construction of EMR shields, anechoic chambers and the immunization of seagoing and airborne craft against radar detection.

The finer the mesh of the sintering metal particles, the more effective is the absorption and dispersion of the EMRs. Mesh of 2 to 30 microns are recommended.

The progressive concentration of the metal particles within the plastic substance can be achieved by either the spraying of superimposed layers of material with gradually increasing or decreasing metal particle concentration, or by homogeneous dispersion of the metal particles throughout the plastic matrix followed by the centrifugal concentration of the particles toward the distal surface while the substance is still in a malleable state.

Figure 4:
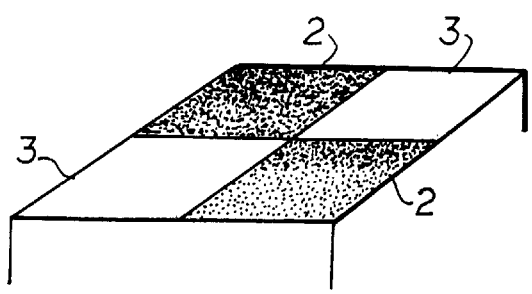
FIG. 4 is a perspecive view of a multi-color identification plate.

It should be noted that any one of the compositions can be colored throughout in a variety of hues by using plastic substances into which a pigment has been grounded prior to mixture with the powder particles. For instance, the combination of a white pigmented polyester with a pewter powder can yield a blue/gray surface colorations. The combination of a white pigmented polyester with copper particles will yield a pink colored surface. White polyester and brass particles yield a white-gold appearance, while black polyester and brass creates an antique (Spanish) brass look. Accordingly, single or multi-color plates can be manufactured, for the purpose of identification and optical recognition by satellites of seagoing and land-based structures, that are virtually corrosion-free and immune to environmental conditions. FIG. 4 illustrates such a plate 1 using a two-color 2,3 pattern.

While the preferred embodiments of the invention have been described, modifications can be made and other embodiments may be devised without departing from the spirit of the invention and the scope of the appended claims.

What is claimed is:

1. A dielectric material which comprises approximately 50% to 95% per weight of atomized metal particles commonly used in sintering powder metallurgy, said particles having a mesh ranging from 2 to 150 microns in a thermosetting resin matrix cured to hardness, wherein said metal particles are selected from a group consisting of particles of copper, zinc, aluminum, silver, steel, lead, tungsten, molybdenum, cobalt, and composites and alloys thereof.

2. The material of claim 1, wherein said resin comprises an isophthalic, acid-based polyester.

3. The material of claim 1, wherein said metal particles consist of particles of bronze.

4. The material of claim 1, wherein said metal particles consist of particles of brass.

5. The material of claim 1, wherein said particles consist of particles of stainless steel.

6. The material of claim 1, wherein said particles consist of particles of lead.

7. A process for manufacturing a dielectric material which comprises:

mixing at room temperature up to 95% per weight of atomized metal particles commonly used in sintering powder metallurgy, said particles having a mesh ranging from approximately 2 to 150 microns and a volume of thermosetting resin;

curing said mixture to hardness at ambient temperatures up to 150° C.; and finishing said applied and hardened mixture.

8. The process of claim 7, wherein said resin is selected from a group consisting of epoxy resins and polyester resins.

9. The process of claim 8, wherein said catalyst compirses two percent of said volume of a ketonic catalyst.

10. The process of claim 9, wherein said ketonic catalyst is a methyl ethyl keton peroxide.

* * * * *